(12) United States Patent
Yakunin et al.

(10) Patent No.: US 9,377,695 B2
(45) Date of Patent: Jun. 28, 2016

(54) GRAZING INCIDENCE REFLECTORS, LITHOGRAPHIC APPARATUS, METHODS FOR MANUFACTURING A GRAZING INCIDENCE REFLECTOR AND METHODS FOR MANUFACTURING A DEVICE

(75) Inventors: Andrei Mikhailovich Yakunin, Mierlo (NL); Vadim Yevgenyevich Banine, Deurne (NL); Olav Waldemar Vladimir Frijns, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 223 days.

(21) Appl. No.: 13/983,214

(22) PCT Filed: Jan. 18, 2012

(86) PCT No.: PCT/EP2012/050676
§ 371 (c)(1),
(2), (4) Date: Nov. 25, 2013

(87) PCT Pub. No.: WO2012/113591
PCT Pub. Date: Aug. 30, 2012

(65) Prior Publication Data
US 2014/0078486 A1    Mar. 20, 2014

Related U.S. Application Data

(60) Provisional application No. 61/446,257, filed on Feb. 24, 2011.

(51) Int. Cl.
*G03B 27/72* (2006.01)
*G03F 7/20* (2006.01)
(Continued)

(52) U.S. Cl.
CPC ................. *G03F 7/702* (2013.01); *B82Y 10/00* (2013.01); *G02B 5/0891* (2013.01); *G03F 7/70058* (2013.01); *G21K 1/062* (2013.01); *G21K 2201/061* (2013.01)

(58) Field of Classification Search
CPC ..... G03F 7/70058; G03F 7/702; G21K 1/062; G21K 2201/061; G02B 5/0891
USPC ...................................................... 355/67, 71
See application file for complete search history.

(56) References Cited

U.S. PATENT DOCUMENTS

| 6,285,737 B1 | 9/2001 | Sweatt et al. |
| 2005/0117233 A1 | 6/2005 | Kanazawa et al. |

(Continued)

FOREIGN PATENT DOCUMENTS

| EP | 1 882 984 A1 | 1/2008 |
| EP | 2 083 327 A1 | 7/2009 |

(Continued)

OTHER PUBLICATIONS

International Search Report directed to related International Patent Application No. PCT/EP2012/050676, mailed May 10, 2012; 3 pages.

(Continued)

*Primary Examiner* — Peter B Kim
(74) *Attorney, Agent, or Firm* — Sterne, Kessler, Goldstein & Fox P.L.L.C.

(57) ABSTRACT

A grazing incidence reflector (300) for EUV radiation includes a first mirror layer (310) and a multilayer mirror structure (320) beneath the first mirror layer. The first mirror layer reflects at least partially EUV radiation incident on the reflector with grazing incidence angles in a first range, and the first mirror layer transmits EUV radiation in a second range of incidence angles, which overlaps and extends beyond the first range of incidence angles. The multilayer mirror structure reflects EUV radiation that is incident on the reflector with grazing incidence angles in a second range that penetrates through the first mirror layer. A grazing incidence reflector can be used in a lithographic apparatus and in manufacturing a device by a lithographic process.

17 Claims, 6 Drawing Sheets

(51) Int. Cl.
  B82Y 10/00  (2011.01)
  G02B 5/08   (2006.01)
  G21K 1/06   (2006.01)

(56) References Cited

U.S. PATENT DOCUMENTS

| | | |
|---|---|---|
| 2005/0279951 A1 | 12/2005 | Bakker |
| 2007/0114470 A1 | 5/2007 | Bowering |
| 2010/0091941 A1 | 4/2010 | Zocchi et al. |
| 2010/0182710 A1* | 7/2010 | Dinger et al. ............ 359/883 |
| 2010/0284511 A1 | 11/2010 | Zocchi et al. |
| 2012/0328082 A1 | 12/2012 | Kubo et al. |
| 2013/0010275 A1 | 1/2013 | Medvedev et al. |
| 2013/0188248 A1 | 7/2013 | Tsarfati et al. |

FOREIGN PATENT DOCUMENTS

| | | |
|---|---|---|
| JP | H05-346496 A | 12/1993 |
| JP | H09-236696 A | 9/1997 |
| JP | 2005-156201 A | 6/2005 |
| JP | 2005-347757 A | 12/2005 |
| JP | 2009-545181 A | 12/2009 |
| JP | 2011-007501 A | 1/2011 |
| JP | 2012-013685 A | 1/2012 |
| JP | 2012-518270 A | 8/2012 |
| JP | 2013-538433 A | 10/2013 |
| WO | WO 2009147014 A1 * | 12/2009 |
| WO | WO 2010/003487 A1 | 1/2010 |
| WO | WO 2010/091907 A | 8/2010 |

OTHER PUBLICATIONS

International Preliminary Report on Patentability and Written Opinion of the International Searching Authority directed to related International Patent Application No. PCT/EP2012/050676, issued Aug. 27, 2013; 8 pages.

* cited by examiner

GRAZING INCIDENCE REFLECTORS, LITHOGRAPHIC APPARATUS, METHODS FOR MANUFACTURING A GRAZING INCIDENCE REFLECTOR AND METHODS FOR MANUFACTURING A DEVICE

CROSS-REFERENCE TO RELATED APPLICATIONS

This application claims the benefit of U.S. provisional application 61/446,257 which was filed on 24 Feb. 2011, and which is incorporated herein in its entirety by reference.

FIELD

The present invention relates to optical elements, more particularly to grazing incidence reflectors. The invention further relates to lithographic apparatus including such a reflector, methods for manufacturing a grazing incidence reflector and methods of manufacturing products by EUV lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

EUV optical systems like lithographic apparatus may include both normal incidence reflectors (plane or curved mirrors) and grazing incidence reflectors. There is no material that by itself forms a good reflector of EUV radiation, so that the normal incidence mirrors need to be constructed as a multilayer structure with tens of pairs of alternating layers of different materials, whose composition and thicknesses are tuned precisely to the wavelength of the radiation to be reflected. The layer thicknesses (hence the period of the multilayer repeating structure) must also be set with regard to the angle of incidence of the radiation. Grazing incidence reflectors, on the other hand, have a much simpler structure, typically a single mirror surface layer of, for example, ruthenium (Ru). Reflectivities at EUV wavelengths in both types of reflector are already low compared to reflectors at longer wavelengths, which is a particular problem since a typical EUV lithographic system may have several mirrors. For example, a EUV lithographic system may have nine mirrors: two in the illumination optics, six in the imaging optics plus the reflecting mask. It is therefore evident that even a small decrease of 1% in the peak reflectance of a single mirror will cause a significant light throughput reduction in the optical system.

The reflectance of a grazing incidence reflector decreases markedly as the angle of incidence rises toward normal. The wavelength of radiation in a present lithographic apparatus is about 13.5 nm and a Ru layer reflects 50% of the incident radiation only up to around 25 degrees incidence angle (where zero degrees means parallel to the reflector surface). To exploit higher numerical aperture sources, it would be valuable to be able to increase this angle, even by a few degrees. For future systems with a shorter wavelength of radiation, for example about 6.7 nm, it is found that the reflectance of a grazing incidence mirror decreases even more rapidly with the increase of grazing incidence angles. Again, the ability to increase the acceptance angle by even a few degrees would contribute greatly to the efficiency and performance achievable in such systems.

SUMMARY

It is desirable to have a grazing incidence reflector with extended angular acceptance and high reflectance.

According to an embodiment of the invention, there is provided a grazing incidence reflector for EUV radiation. The grazing incidence reflector comprises a first mirror layer and a multilayer mirror structure beneath the first mirror layer. The first mirror layer is configured to reflect at least partially EUV radiation incident on the reflector with grazing incidence angles in a first range, and to transmit EUV radiation in a second range of incidence angles that overlaps and extends beyond the first range of incidence angles. The multilayer mirror structure is configured to reflect EUV radiation that is incident on the reflector with grazing incidence angles in said second range and that penetrates through the first mirror layer. As an example, the first mirror layer may have a thickness of less than 20 nm.

In one embodiment of the invention, the grazing incidence reflector may further comprise a second mirror layer on top of first mirror layer. The second mirror layer is configured to provide enhanced reflectance for EUV radiation with grazing incidence angles in a third range, which is within the first range of angles. As an example, the second mirror layer may have a thickness of less than 10 nm and has a reflectance greater than 40%, possibly over 50%, over a range of grazing incidence angles extending from 0 degree to less than 10 degrees.

In another embodiment of the invention, the first mirror layer may occupy only a portion of a surface of the multilayer mirror structure so as to provide enhanced reflectance for EUV radiation with grazing incidence angles in the second range.

In another embodiment of the invention, the grazing incidence reflector may be configured for operation at EUV wavelengths in the range 5-10 nm, more particularly 6-7 nm, and for example in the range 6.5 nm-6.8 nm.

In one example, the first mirror layer may have a thickness in the range 15-17 nm and may be made of $ThO_2$, and have a reflectance greater than 40% over the first range of grazing incidence angles between greater than 0 degree and less than 12 degrees.

In another example, the second range of grazing incidence angles may be greater than or equal to 12 degrees and less than or equal to 14 degrees. The multilayer mirror structure may be formed of a number of laminated elements. Each laminated element may have a first sub-unit and a second sub-unit on top of the first sub-unit. The second sub-unit may have a lower index of refraction than that of the first sub-unit.

In a further example, the materials of the first sub-unit and the second sub-unit may be selected from a group of Th, La, U, B, nitrides, oxides, borides, fluorides of heavy metal elements, and carbides of light elements.

In yet another embodiment of the invention, the grazing incidence reflector is configured for operation at EUV wavelength in the range 13-14 nm, for example, 13.5 nm.

In one example, the first mirror layer may have a thickness in the range 15-17 nm and may be made of Ru, and have a reflectance greater than 40%, possibly over 50%, over the first range of grazing incidence angles between greater than 0 degree and less than 25 degrees.

In another example, the second range of grazing incidence angles may be greater than or equal to 25 degrees and less than or equal to 30 degrees. The multilayer mirror structure may be formed of a number of laminated elements and each laminated element have a first sub-unit and a second sub-unit on top of the first sub-unit, the second sub-unit having a lower index of refraction than that of the first sub-unit.

In a further example, materials of the first sub-unit and the second sub-unit are selected from a group of Mo, Si, Ru and diamond-like carbon.

In yet another embodiment of the invention, at least one of a period and a composition of the multilayer mirror structure varies across the multilayer mirror structure so that a grazing incidence angles of maximal reflectance varies across the multilayer mirror structure.

In yet another embodiment of the invention, it is provided with a lithographic apparatus including a grazing incidence reflector as described above.

In yet another embodiment of the invention, it is provided with a method for manufacturing a grazing incidence reflector configured to reflect extreme ultraviolet (EUV) radiation. The method comprises depositing a first mirror layer on top of a multilayer mirror structure and a surface structure on top of the middle structure. The first mirror layer is configured to at least partially reflect EUV radiation incident on the reflector with grazing incidence angles in a first range, and to transmit EUV radiation in a second range of incidence angles that overlaps and extends beyond the first range of incidence angles. The multilayer mirror structure is configured to reflect EUV radiation that is incident on the reflector with grazing incidence angles in said second range, and which penetrates through the first mirror layer.

In yet another embodiment of the invention, it is provided with a method for manufacturing a device by a lithographic process. The method comprises: illuminating a patterning device with EUV radiation from an EUV source via an illumination system; and projecting an image of the patterning device onto a substrate by projection of said EUV radiation via projection system. In the method, at least one of the illumination system or the projection system comprises a grazing incidence reflector as described above.

Various features and advantages of the invention, as well as the structure and operation of various embodiments of the present invention, are described in detail below with reference to the accompanying drawings. The invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
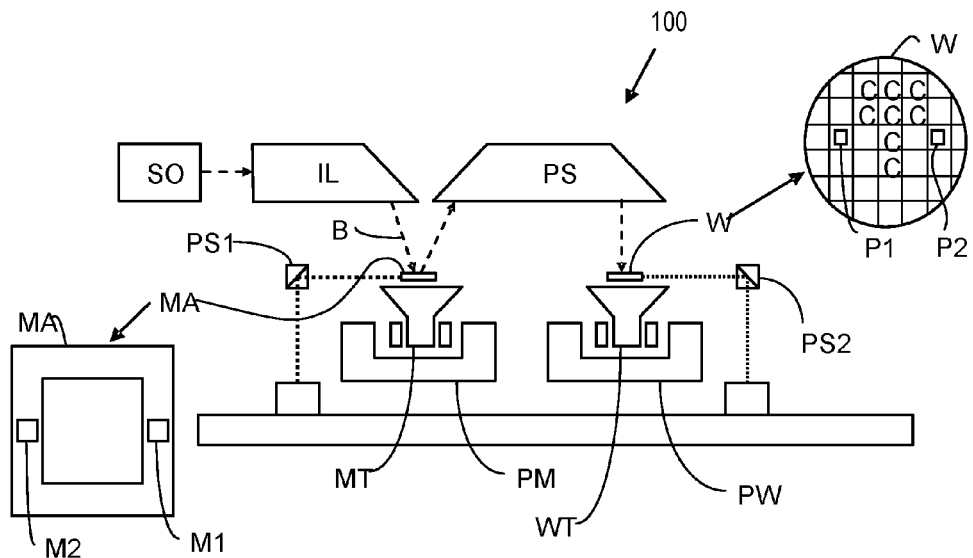
FIG. 1 depicts an exemplary lithographic apparatus according to an embodiment of the invention.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

FIG. 1 schematically depicts a lithographic apparatus 100 including a source collector module SO according to one embodiment of the invention. The apparatus comprises:

an illumination system (illuminator) IL configured to condition a radiation beam B (e.g., EUV radiation);

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
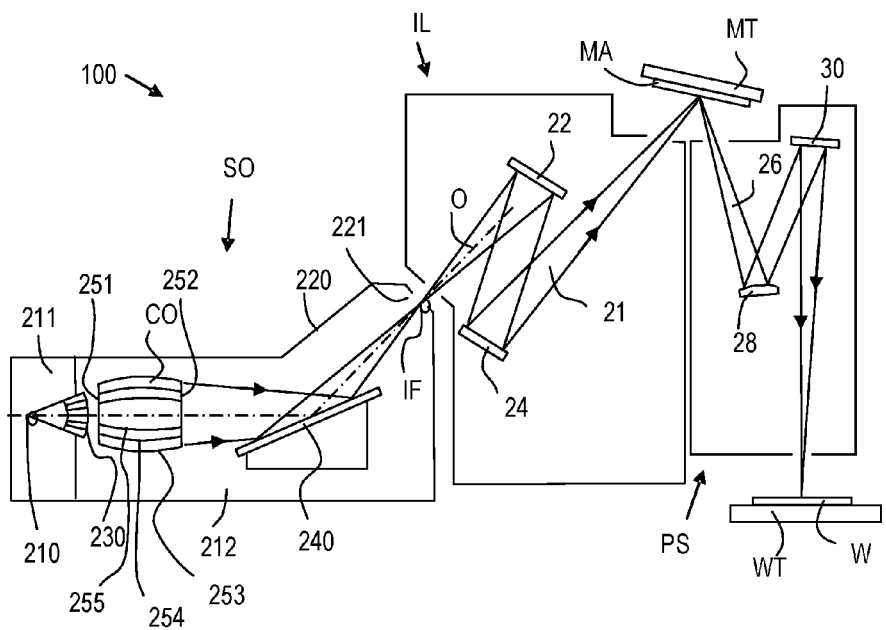
FIG. 2 is a more detailed view of the apparatus 100 as shown in FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO, which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Alternatively, the source collector module SO may be part of an LPP radiation system. A laser is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components. In EUV lithography, the optical elements are generally reflective. The term 'mirror' may be used for convenience, as an alternative to 'reflector.' No difference in meaning is intended.

Figure 3:
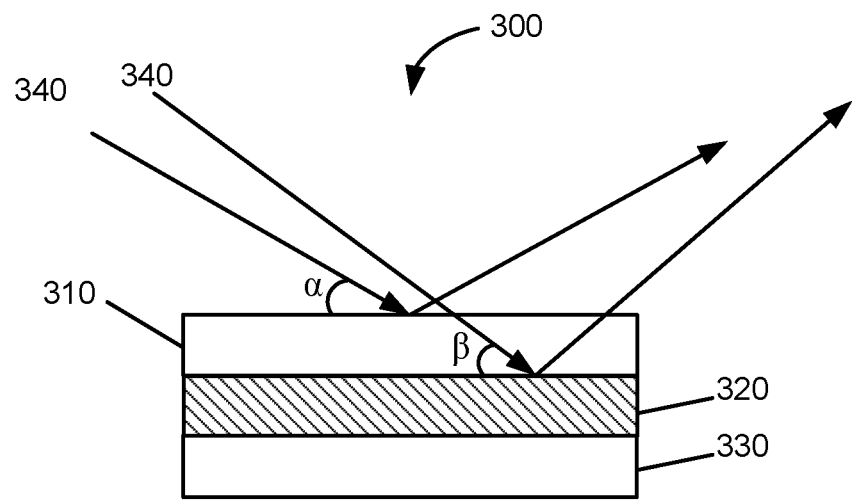
FIG. 3 is an exemplary grazing incidence reflector according to an embodiment of the present invention.

FIG. 3 shows an exemplary grazing incidence reflector 300 according to an embodiment of the present invention. The reflector 300 is configured for operation at extreme ultraviolet radiation. As shown in FIG. 3, grazing incidence reflector 300 includes a first mirror layer 310 and a multilayer mirror structure 320, formed on a substrate 330.

First mirror layer 310 is configured to reflect EUV radiation 340 with grazing incidence in a first range. The radiation for the present examples may have a wavelength around 13.5 nm. In one exemplary embodiment, first mirror layer 310 has a thickness of less than 20 nm. Multilayer mirror structure 320 is beneath first mirror layer 310. When EUV radiation 340 is incident on reflector 300 with grazing incidence angles in a second range of grazing incidence angles, EUV radiation 340 may penetrate through first mirror layer 310. Multilayer mirror structure 320 is configured to reflect EUV radiation 340 that penetrates through first mirror layer 310. The design of such structures from alternating layers of Mo/Si, for example, is known in the art. For application in the present embodiment, the composition and period of the layers in the structure are selected (tuned) for grazing incidence angles within the second range of angles. The second range of grazing incidence angles overlaps and extends beyond the first range of incidence angles. The period of the multilayer structure refers to the height of each repeating unit, and may be measured nanometers. For grazing incidence reflectors at EUV wavelengths, the period may for example be several tens of nanometers. The composition of the multilayer structure refers to the selection of the materials for the alternating layers, and also to the ratio of thickness of the materials. A ratio Γ is generally defined as the ratio of the thickness of one of the layers to the overall thickness of the layer pair (i.e., the period). Thus a Mo/Si multilayer with Γ=0.3 may comprise 12 nm layers of Mo alternating with 28 nm layers of Si.

The term 'grazing incidence angle' or 'angle of incidence' in this description means an angle relative to the tangent plane to an incident point of the mirror surface. In the illustrated examples, which are all plane mirrors, zero incidence angle refers to a ray that runs parallel to the surface. In FIG. 3, exemplary grazing incidence angles α and β are illustrated for first mirror layer 310 and multilayer mirror structure 320 respectively. Grazing incidence angle α is in the first range of grazing incidence angles. Grazing incidence angle β is in the second range of grazing incidence angles.

Therefore, by providing first mirror layer 310 with a multilayer mirror structure 320 in which first mirror layer 310 is configured to reflect EUV radiation with grazing incidence angles in a first range and multilayer mirror structure 320 is configured to reflect EUV radiation in a second range, and by arranging that radiation in the second range passes through the first mirror layer rather than simply being absorbed, grazing incidence reflector 300 is capable of reflecting EUV radiation incident on reflector 300 with grazing incidence angles throughout the first and second ranges. By suitably tuning the properties of each component 310, 320, we can usefully extend the angular acceptance for EUV radiation as compared to that of a conventional grazing incidence mirror. The same principles can be extended to design reflectors for other wavelengths, as will be mentioned below. Note that the tuning could result in a first mirror being identical in form to one of the layers of the multilayer mirror structure. In that case, the first mirror layer is effectively formed by the top layer of the multilayer mirror structure. In general, however, it may be different in material and/or thickness.

For example, the first range of angles may extend from zero to around 25 degrees, while the second range extends from below 25 degrees to, say, 30 degrees. It should be noted that the term 'overlaps' is used merely to indicate that the combined effect of the mirror layer 310 and multilayer mirror structure 320 is to maintain reflectance over continuous range of angles. The individual layers/structures do not require to have reflectance above 50% (R>0.5), for example, in the overlapping part of their ranges. While R>0.5 is used in the present examples as a performance threshold for the reflector at a given angle of incidence, this is purely for the sake of example and other performance thresholds can be chosen. For example R>0.4 (40% reflectance) may be considered an acceptable performance in a particular application; R>60% may be desired in another application.

Figure 4:
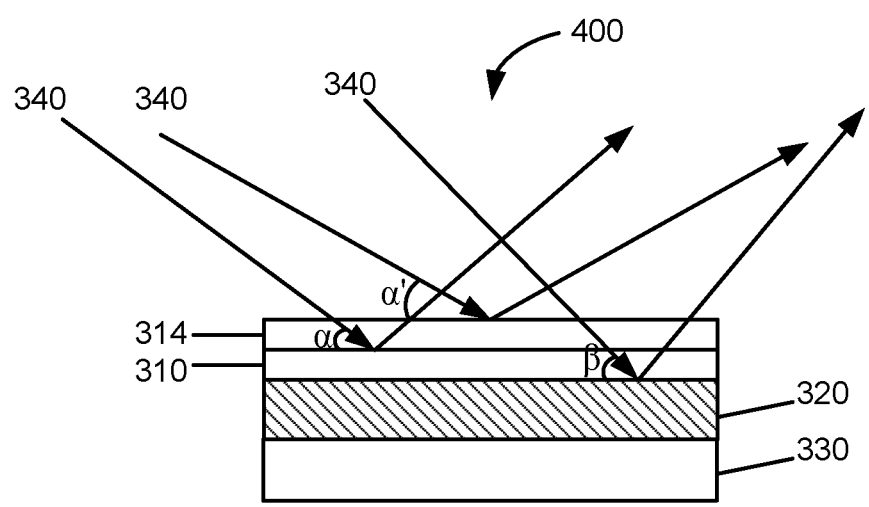
FIG. 4 is an exemplary grazing incidence reflector according to another embodiment of the present invention.

FIG. 4 shows a grazing incidence reflector 400 according to another exemplary embodiment of the present invention. Grazing incidence reflector 400 is substantially similar to grazing incidence reflector 300 as shown in FIG. 3, except that grazing incidence reflector 400 has a second mirror layer 314 on top of the first mirror layer 310.

Second mirror layer 314 is configured to reflect EUV radiation with grazing incidence angles in a third range. The third range is within the first range of angles, and in particular comprises the very smallest grazing incidence angles. Although first mirror layer 310 reflects such radiation to a reasonable extent, it must be designed by compromise to reflect also at higher angles. Second mirror layer 314 can be designed to reflect EUV radiation at smaller grazing incidence angles α' more completely than that of the first mirror layer 310, while transmitting radiation at higher angles to be reflected by the layer below. In one exemplary embodiment, second mirror layer 314 has a thickness of less than 10 nm and is made of Mo. Second mirror layer 314 may have a reflectance greater than 50% (R>0.5) over the third range of grazing incidence angles that may, for example, be greater than 0 degree and less than 10 degrees.

Figure 5:
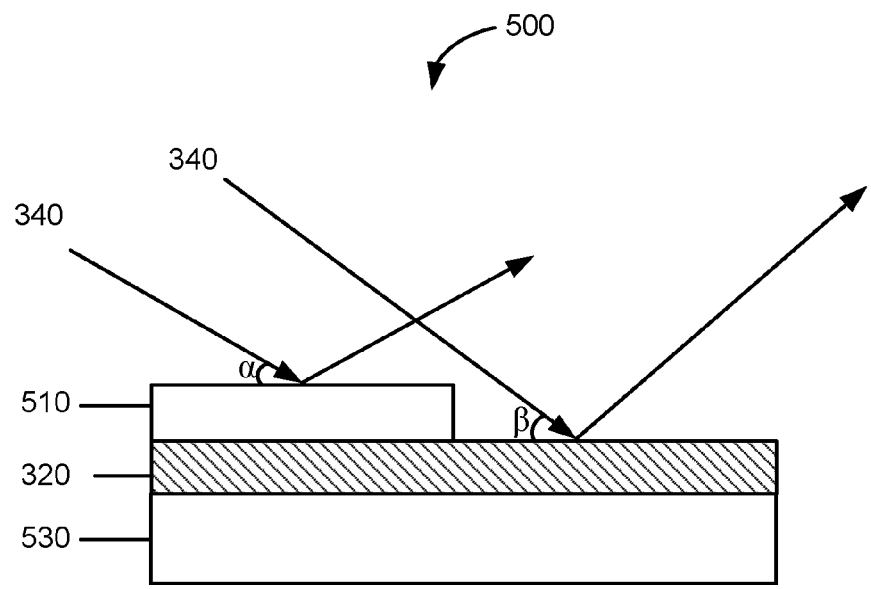
FIG. 5 is an exemplary grazing incidence reflector according to another embodiment of the present invention.

FIG. 5 shows an exemplary grazing incidence reflector 500 according to another embodiment of the present invention. Grazing incidence reflector 500 is substantially similar to grazing incidence reflector 300 as shown in FIG. 3, except that grazing incidence reflector 500 has a first mirror layer 510 that occupies only a portion of a surface of multilayer mirror structure 320, formed on a substrate 530. First mirror layer 510 is only applied to locations of a surface of multilayer mirror structure 320 where EUV radiation 340 with grazing incidence angles only or predominantly within the first range is to be reflected. Consequently, EUV radiation 340 with grazing incidence angles in the second range is directly incident on multilayer mirror structure 320 without penetrating through first mirror layer 510. Therefore, because first mirror layer 510 occupies only a portion of a surface of the multilayer mirror structure, reflectance for EUV radiation with grazing incidence angles in the second range is enhanced.

Figure 6:
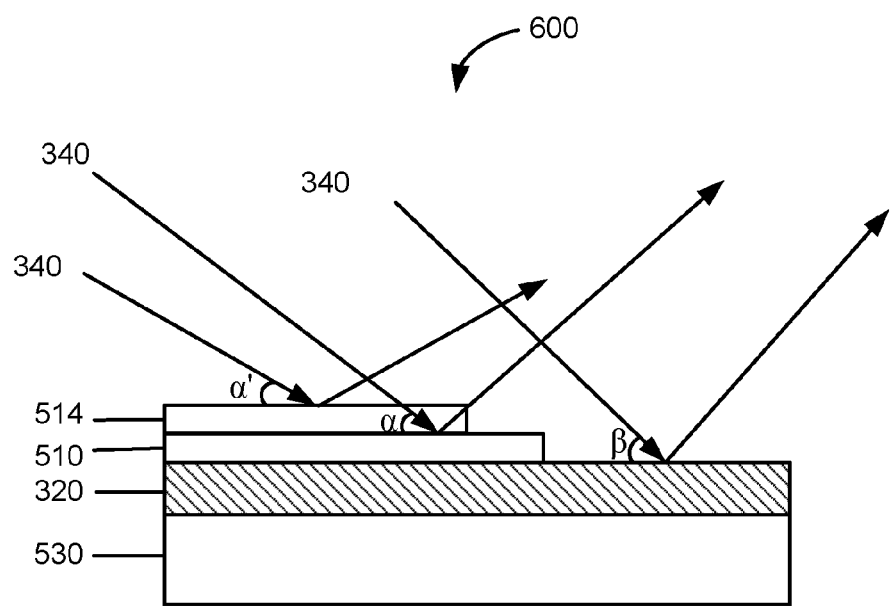
FIG. 6 is an exemplary grazing incidence reflector according to another embodiment of the present invention.

FIG. 6 shows an exemplary grazing incidence reflector 600 according to a further embodiment of the present invention. Grazing incidence reflector 600 is substantially similar to grazing incidence reflector 500 as shown in FIG. 5, except that grazing incidence reflector 600 has a second mirror layer 514 on top of first mirror layer 500.

Second mirror layer 514 is configured to reflect EUV radiation with grazing incidence angles in the third range. The third range of grazing incidence angles is within the first range of grazing incidence angles. In particular, second mirror layer 514 is capable of reflecting EUV radiation with the smallest grazing incidence angles, as compared to that of the first mirror layer 510. In one exemplary embodiment, second mirror layer 514 has a thickness of less than 10 nm. Second mirror layer 514 may be made of Mo. Second mirror layer 514 may have a reflectance greater than 50% over the third range of grazing incidence angles which may, for example, be greater than 0 degree and less than 10 degrees.

In another exemplary embodiment of the present invention, a grazing incidence is configured for operation at EUV wavelength in the range of 5 to 10 nm, for example in the range of 6 to 7 nm or 6.5 to 6.8 nm. The reflector may otherwise have the same form as one of the grazing incidence reflectors described in the embodiments of FIGS. 3 to 6, or a combination thereof.

The multilayer mirror structure may include a number of laminated units, each laminated unit comprising for example a layer pair having a layer of material forming a first sub-unit and layer of material forming a second sub-unit on top of the first sub-unit. The second sub-unit has a lower index of refraction than that of the first sub-unit. Materials of the first sub-unit can be selected from Th, La, U, as well as nitrides, oxides, borides and fluorides of such heavy metal elements. Materials of the second sub-unit can be selected from a group comprising a light elements, particularly boron B, and carbides of light elements such as $B_4C$ or $B_9C$. For each wavelength in the EUV range, the selection of materials is very specific. The first mirror layer 310 or 510 may be made of material similar to the first sub-unit of the multilayer structure, for example Th or $ThO_2$. The second mirror layer 314 or 514 may be made of another material, for example $ThO_2$ (when on top of a first mirror layer of Th), or CsH or thin layers of $B_4C$ or $B_9C$.

Figure 7:
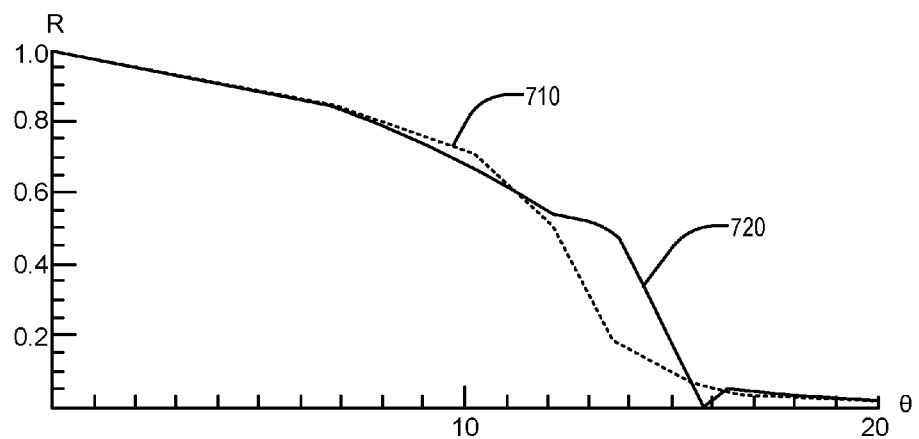
FIG. 7 is a simulation plot for EUV radiation of a wavelength of 6.7 nm with EUV radiation grazing incidence angles θ in degrees against the reflectance R.

FIG. 7 shows a calculated plot for two exemplary grazing incidence reflectors with EUV radiation grazing incidence angles θ in degrees against the reflectance R. Such calculations can be performed, supplemented with physical experiments as appropriate, to optimize the design of the reflector for performance over a desired range of angles. The wavelength of EUV radiation is 6.7 nm. In this simulation plot for the exemplary grazing incidence reflectors, the first mirror layer is made from $ThO_2$, and the first and second sub-units of the multilayer mirror structure are paired from $ThO_2$ and $B_4C$. In FIG. 7, curve 710 represents the reflectance of a sample having a thickness of first mirror layer of 40 nm, on top of a multilayer mirror structure with period 1 nm and the ratio Γ=0.3. Curve 720 represents the thickness of the first mirror layer of 16 nm on top of the multilayer mirror structure with period 15 nm and the ratio Γ=0.7 ($B_4C$ on top). According to FIG. 7, we see that for EUV radiation with a wavelength of 6.7 nm, compared to the reflectance of the grazing incidence reflector with a 40 nm thickness first mirror layer, the grazing incidence reflector with a 16 nm thickness first mirror layer has a higher reflectance for θ in the range of 12 to 14 degrees. For θ in the range of 0 to 12 degrees, the grazing incidence reflector with a 16 nm thickness has a similar reflectance to the grazing incidence reflector with a 40 nm thickness. A typical known grazing incidence reflector comprising a single layer of material might have a thickness of 40 nm, similar to the first mirror layer in the example of curve 710. The curve 710 illustrates how putting a multilayer mirror structure under such a thick layer does not bring any benefit, because radiation above the first range of angles does not penetrate the conventional grazing incidence reflector. However, for a given reflectance, a grazing incidence reflector with a thin first mirror layer and an underlying multilayer mirror structure can have useful reflectance with a higher angular acceptance. The value of 16 nm, represented by the curve 720, was found in these simulations to be optimal. The thickness of the overlying first mirror layer may for example be less than 20 nm, for example in the range 10-20 nm or 14-20 nm.

In a further exemplary embodiment of the present invention, a grazing incidence reflector may be configured for operation at EUV wavelength in the range of 13 to 14 nm, for example 13.5 nm. The multilayer mirror structure of the grazing incidence reflector is formed of a number of laminated units, each laminated unit having a first sub-unit and a second sub-unit on top of the first sub-unit, the second sub-unit having a lower index of refraction than that of the first sub-unit. Materials of the first sub-unit are selected from Mo, Ru and diamond-like carbon (DLC). The second sub-unit is typically Si. In one embodiment, the first mirror layer has a thickness of 16 nm and is made of Ru. The first mirror layer has a reflectance greater than 50% over the first range of grazing incidence angles, which extends from 0 degrees to around 25 degrees.

The multilayer mirror structure may have a reflectance greater than 50% (or some lower threshold if acceptable) over the second range of grazing incidence angles, which extends from, say, 22 degrees to around 30 degrees.

Figure 8:
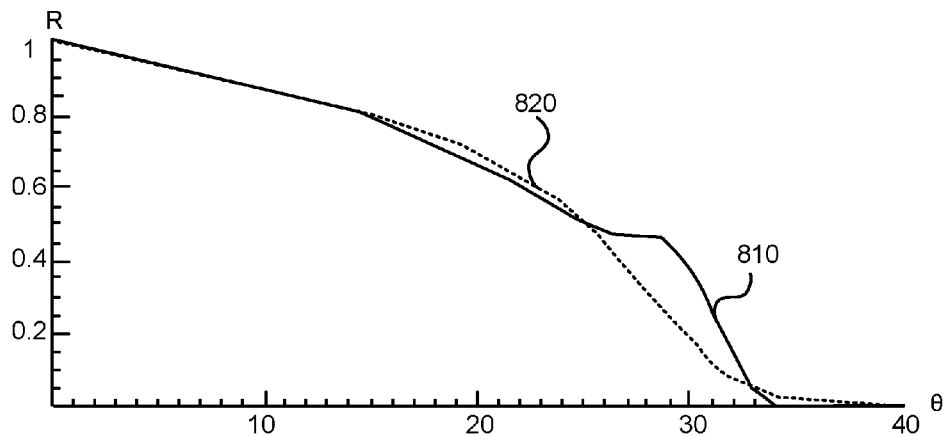
FIG. 8 is another simulation plot for EUV radiation of a wavelength of 13.5 nm with EUV radiation grazing incidence angles θ in degrees against the reflectance R.

FIG. 8 shows another calculated plot for two grazing incidence reflectors with an EUV radiation grazing incidence angle θ in degrees against the reflectance R. The wavelength of EUV radiation is 13.5 nm. In this simulation plot for the exemplary grazing incidence reflectors, the first mirror layer is made from Ru, and the units of multilayer mirror structure are selected and paired from Si and Mo. In FIG. 8, curve 810 is drawn as the first mirror layer has a thickness of 16 nm, the multilayer mirror structure has a period of 16 nm and the ratio Γ is 0.5 (Si on top), while curve 820 is drawn as the first mirror layer has a thickness of 20 nm, the multilayer mirror structure has a period of 2 nm and the ratio Γ is 0.5. FIG. 8 shows that under the EUV radiation with a wavelength of 13.5 nm, compared to reflectance of the grazing incidence reflector with a 20 nm thickness first mirror layer, the grazing incidence reflector with a 16 nm thickness first mirror layer has a higher reflectance for θ in the range of 25 to 30 degrees. For θ in the range of 0 to 25 degrees, the grazing incidence reflector with a 16 nm thickness has a similar reflectance with the grazing incidence reflector with a 20 nm thickness. Therefore, for a given reflectance, a grazing incidence reflector with a thin first mirror layer and underlying multilayer mirror structure can have higher angular acceptance.

Figure 9:
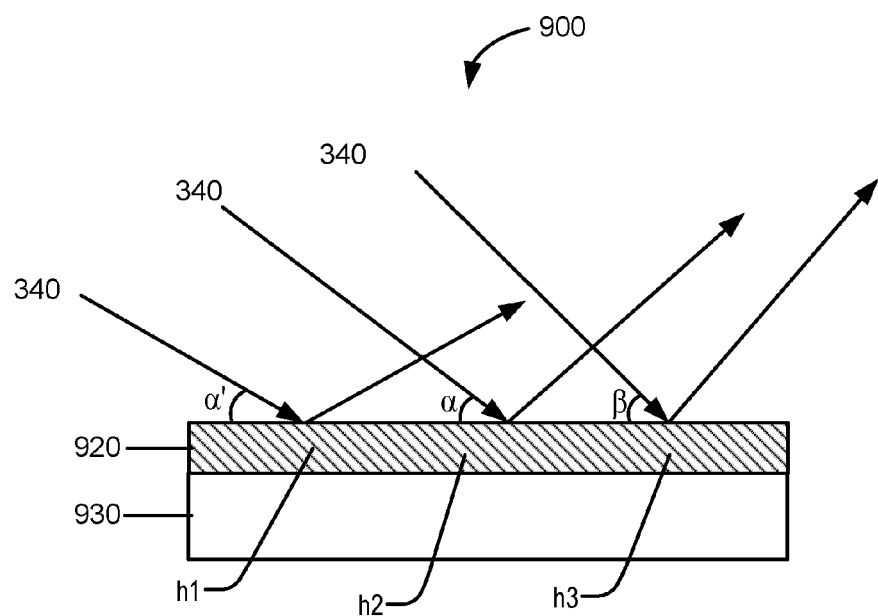
FIG. 9 is an exemplary grazing incidence reflector according to another embodiment of the present invention.

FIG. 9 shows an exemplary grazing incidence reflector 900 according to an embodiment of the present invention. Grazing incidence reflector 900 is configured for operation at EUV wavelength in the range of 5 to 10 nm, for example in the range of 6 to 7 nm or 6.5 to 6.8 nm Grazing incidence reflector 900 includes a multilayer mirror structure 920 formed on a substrate 530. Grazing incidence reflector 900 is configured to reflect EUV radiation with different grazing incidence angles through different portions of multilayer mirror structure 920, as will now be explained.

Figure 10:
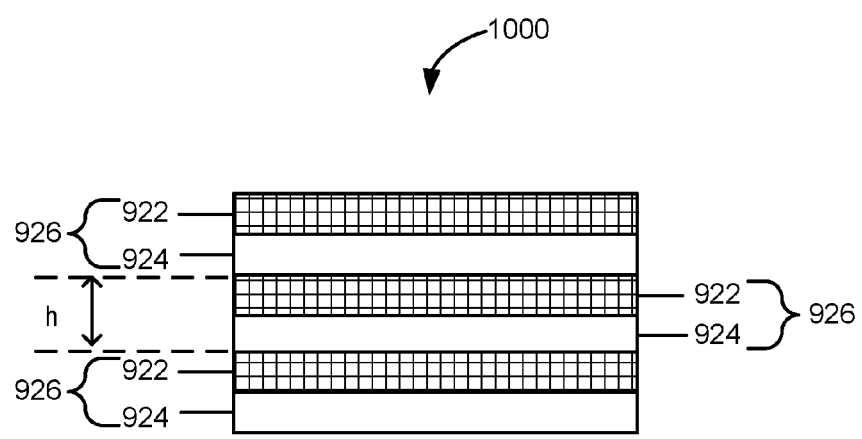
FIG. 10 is an illustration for an exemplary multilayer mirror structure of a grazing incidence reflector according to an embodiment of the present invention.

FIG. 10 shows an exemplary multilayer mirror structure 920 as shown in FIG. 9. Multilayer mirror structure 920 may exhibit high reflectance to EUV radiation. As shown in FIG. 10, multilayer mirror structure 920 is formed of a number of laminated units 926. Multilayer mirror structure 920 may comprise several tens to several hundreds of laminated units.

Each laminated unit 926 includes a first sub-unit 924 and a second sub-unit 922 on top of the first sub-unit 924. The sub-units in the examples described herein are simple layers of materials exhibiting the highest available boundary-amplitude reflectance. More complicated sub-units may be provided, if desired. The second sub-unit 922 has a lower index of refraction than that of the first sub-unit 924. The number of units will be several tens in practice, though only three are shown. In one embodiment, the thickness h of each unit (the period of the repeating structure) and the ratio of the thicknesses of the sub-units is configured to achieve alignment of the phases of EUV radiation light waves reflected from the various sub-units, at the desired wavelength and for a desired range of incidence angles. To achieve maximal reflectance, at least of one of the period and composition of multilayer mirror structure varies between the different areas of grazing incidence reflector 900 according to the expected incidence angles, such as $\alpha$, $\alpha'$ and $\beta$ shown in FIG. 9, at different parts of the reflector. Therefore, as shown in FIG. 9 if different areas of the grazing incidence reflector 900 are configured with different periods h=h1, h2, h3, to reflect EUV radiation with different grazing incidence angles $\alpha$, $\alpha'$ and $\beta$ respectively.

Figure 11:
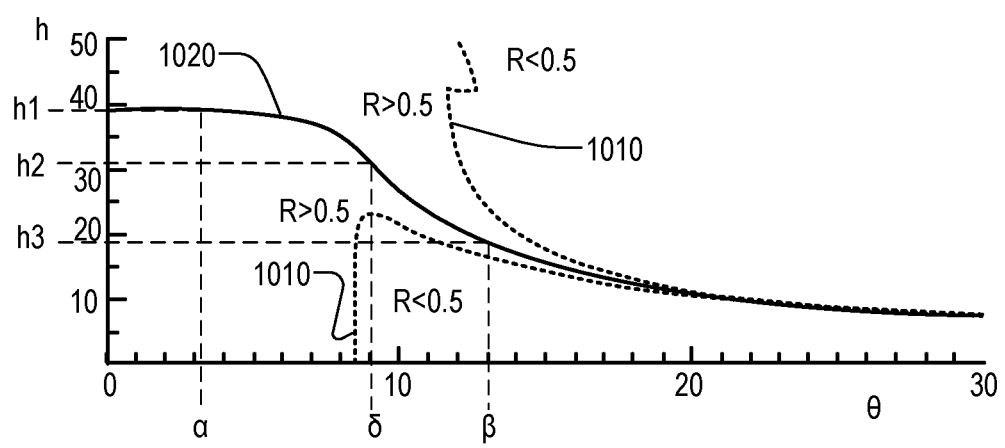
FIG. 11 is a simulation plot of the period h of a multilayer mirror structure as a function of the incidence angles θ.

FIG. 11 shows a calculated plot of the reflectance R as a function of both the period h of multilayer mirror (MLM) structure 920 and as a function of the incidence angles $\theta$. In FIG. 11, curve 1010 is the R=0.5 contour of the simulation plot. If more contours were drawn, for example R=0.9, R= 0.8 ... R=0.3, R=0.2 etc, it would be seen that the reflectance depends in a complex manner on the combination of MLM period h and incidence angle, for a given wavelength. To the left of the curve 1010, reflectance generally increases, to the right, it decreases. For increasing incidence angle, the R=0.5 contour bounds a very specific range of periods h, and reflectance is very low outside this range. The curve 1020 shows the period value that gives the highest reflectance R for each angle of incidence. It can be seen that an MLM with period h1, which strongly reflects radiation 340 with a grazing incidence angle $\alpha$, will not strongly reflect the radiation with angle $\beta$. On the other hand, an MLM with period h3 will more strongly reflect radiation at angle $\beta$, but not so strongly the radiation at angle $\alpha$. By setting the period h to different values h1, h2, h3 at different portions of the reflector, the reflectance can be maximized for radiation at corresponding expected angles of incidence $\alpha$, $\alpha'$, $\beta$, by following the curve 1020, which is derived by simulation and/or experiment.

The structure with varying angle $\alpha$s illustrated in FIGS. 9-11 can be used on its own, or as the multilayer mirror structure underlying a mirror layer in the embodiments of FIGS. 3 to 8. It will be understood that the composition of the MLM structure can be varied by varying the period, as mentioned above, by varying the ratio of the component material layers within each period, or a combination of both. In principle, the identity of the materials in the layers could also be varied. Plots similar to FIG. 11 can be calculated to model the effect of the ratio on the reflectance at different incidence angles, and a curve of maximum reflectance can be traced similar to curve 1020, and used in the design of an optimized MLM structure.

A grazing incidence reflector as described in the above embodiments may also be curved, depending on its role in the EUV optical system.

In a lithographic apparatus 100, the collector chamber 212 may include a grazing incidence mirror according to the present invention. The illumination system IL, the projection system PS, or both may also include a grazing incidence reflector according to the present invention. The number of grazing incidence reflectors, the kind or reflectors and the position of reflectors in the collector chamber 212, the illumination system IL and/or the projection system may be determined according to the desired operating characteristics of the lithographic apparatus. It will depend on the particular application, whether a wide range of incidence angles is wanted equally across the reflector, or whether different parts of the reflector can be 'tuned' to different expected ranges of incidence angles, using the modifications described above.

A grazing incidence mirror according to the present invention may be used, for example, in a device manufacturing method, or in a method wherein EUV radiation and a grazing incidence mirror are used.

Manufacturing Method

One method to apply a metal coating on the substrate is by atomic layer deposition (ALD). ALD uses alternating steps of a self-limiting surface reaction to deposit atomic layers one by one. The material to be deposited is provided through a precursor. ALD methods are known for several metals, for example, Mo, Ti, Ru, Pd, Ir, Pt, Rh, Co, Cu, Fe and Ni. Instead of ALD, galvanic growth (electrodeposition) may be used to deposit the metal, or it can also be deposited for example by evaporation or sputter deposition. Examples of such methods are given in the prior art references, mentioned in the introduction. Methods such as sputtering can be adapted to the materials appropriate to 6.x nm wavelengths, such as Th, B, $B_4C$, $B_9C$ and the like. To make ThO2, $LaO_2$, etc, one could first form a layer of Th or La, and then oxidize it. Alternatively, one could form the layer of oxide directly by deposition of the metal Th, La in an oxidizing atmosphere. The latter method can be finished by polishing of the layer by ion or electron beam, to reduce its roughness.

These processes may be used alone or in combination with one another.

Although several different metals may be used, molybdenum is an attractive candidate because of its high melting point and proven vacuum compatibility. Other materials can be chosen for their distinctive properties, however, particularly where a different wavelength of wanted and/or unwanted radiation is involved.

The descriptions above are intended to be illustrative, not limiting. Thus it will be apparent to one skilled in the art that modifications may be made to the invention as described without departing from the scope of the claims set out below.

The breadth and scope of the present invention should not be limited by any of the above-described exemplary embodiments, but should be defined only in accordance with the following clauses and claims and their equivalents.

1. A grazing incidence reflector for extreme ultraviolet (EUV) radiation, comprising:
 a first mirror layer configured to reflect at least partially EUV radiation incident on the reflector with grazing incidence angles in a first range, the first mirror layer being configured to transmit EUV radiation in a second range of incidence angles that overlaps and extends beyond the first range of incidence angles; and
a multilayer mirror structure beneath the first mirror layer configured to reflect EUV radiation that is incident on the reflector with grazing incidence angles in said second range and that penetrates through the first mirror layer.
2. The grazing incidence reflector according to clause 1, wherein the first mirror layer has a thickness of less than 20 nm.
3. The grazing incidence reflector according to clause 1, further comprising:
a second mirror layer on top of first mirror layer, the second mirror layer being configured to provide enhanced reflectance for EUV radiation with grazing incidence angles in a third range that is within the first range of angles.
4. The grazing incidence reflector according to clause 1, wherein the second mirror layer has a thickness of less than 10 nm and has a reflectance greater than 40% over a range of grazing incidence angles extending from 0 degree to less than 10 degrees.
5. The grazing incidence reflector according to clause 1, wherein the first mirror layer occupies only a portion of a surface of the multilayer mirror structure so as to provide enhanced reflectance for EUV radiation with grazing incidence angles in the second range.
6. The grazing incidence reflector according to clause 1, wherein the reflector is configured for operation at EUV wavelengths in the range 6-7 nm.
7. The grazing incidence reflector according to clause 6, wherein the first mirror layer has a thickness in the range 15-17 nm and is made of $ThO_2$, and has a reflectance greater than 40% over the first range of grazing incidence angles between greater than 0 degree and less than 12 degrees.
8. The grazing incidence reflector according to clause 7, wherein:
the second range of grazing incidence angles is greater than or equal to 12 degrees and less than or equal to 14 degrees; and
the multilayer mirror structure is formed of a number of laminated elements, each laminated element having a first sub-unit and a second sub-unit on top of the first sub-unit, the second sub-unit having a lower index of refraction than that of the first sub-unit.
9. The grazing incidence reflector according to clause 8, wherein materials of the first sub-unit and the second sub-unit are selected from a group of Th, La, U, B, nitrides, oxides, borides, fluorides of heavy metal elements, and carbides of light elements.
10. The grazing incidence reflector according to clause 1, wherein the reflector is configured for operation at EUV wavelengths in the range 13-14 nm.
11. The grazing incidence reflector according to claim 10, wherein the first mirror layer has a thickness in the range 15-17 nm and is made of Ru, and has a reflectance greater than 40% over the first range of grazing incidence angles between greater than 0 degree and less than 25 degrees.
12. The grazing incidence reflector according to clause 11, wherein:
the second range of grazing incidence angles is greater than or equal to 25 degrees and less than or equal to 30 degrees; and
the multilayer mirror structure is formed of a number of laminated elements, each laminated element having a first sub-unit and a second sub-unit on top of the first sub-unit, the second sub-unit having a lower index of refraction than that of the first sub-unit.
13. The grazing incidence reflector according to clause 12, wherein materials of the first sub-unit and the second sub-unit are selected from a group of Mo, Si, Ru and diamond-like carbon.
14. The grazing incidence reflector according clause 1, wherein at least one of a period and a composition of the multilayer mirror structure varies across the multilayer mirror structure so that a grazing incidence angles of maximal reflectance varies across the multilayer mirror structure.
15. A lithographic apparatus comprising the grazing incidence reflector according to clause 1.
16. A method for manufacturing a grazing incidence reflector configured to reflect extreme ultraviolet (EUV) radiation, the method comprising:
depositing a first mirror layer on top of a multilayer mirror structure and a surface structure on top of the multilayer mirror structure;
wherein the first mirror layer is configured to at least partially reflect EUV radiation incident on the reflector with grazing incidence angles in a first range, the first mirror layer being configured to transmit EUV radiation in a second range of incidence angles that overlaps and extends beyond the first range of incidence angles; and
the multilayer mirror structure is configured to reflect EUV radiation that is incident on the reflector with grazing incidence angles in said second range and that penetrates through the first mirror layer.
17. A method for manufacturing a device by a lithographic process, comprising:
illuminating a patterning device with extreme ultraviolet (EUV) radiation from an EUV source via an illumination system; and
projecting an image of the patterning device onto a substrate by projection of said EUV radiation via projection system;
wherein at least one of the illumination system or the projection system comprises the grazing incidence reflector of clause 1.

The invention claimed is:
1. A grazing incidence reflector for extreme ultraviolet (EUV) radiation, comprising:
a first mirror layer configured to reflect at least partially EUV radiation incident on the reflector with grazing incidence angles in a first range, the first mirror layer being configured to transmit EUV radiation in a second range of incidence angles which overlaps and extends beyond the first range of incidence angles;
a multilayer mirror structure beneath the first mirror layer configured to reflect EUV radiation which is incident on the reflector with grazing incidence angles in said second range and which penetrates through the first mirror layer; and
a second mirror layer on top of the first mirror layer, the second mirror layer being configured to provide enhanced reflectance for EUV radiation with grazing incidence angles in a third range which is within the first range of angles.
2. The grazing incidence reflector according to claim 1, wherein the first mirror layer has a thickness of less than 20 nm.
3. The grazing incidence reflector according to claim 1, wherein the second mirror layer has a thickness of less than 10 nm and has a reflectance greater than 40% over a range of grazing incidence angles extending from 0 degree to less than 10 degrees.

4. The grazing incidence reflector according to claim 1, wherein the first mirror layer occupies only a portion of a surface of the multilayer mirror structure so as to provide enhanced reflectance for EUV radiation with grazing incidence angles in the second range.

5. The grazing incidence reflector according to claim 1, wherein the reflector is configured for operation at EUV wavelengths in the range 6-7 nm.

6. The grazing incidence reflector according to claim 5, wherein the first mirror layer has a thickness in the range 15-17 nm and is made of $ThO_2$, and has a reflectance greater than 40% over the first range of grazing incidence angles between greater than 0 degree and less than 12 degrees.

7. The grazing incidence reflector according to claim 6, wherein:
the second range of grazing incidence angles is greater than or equal to 12 degrees and less than or equal to 14 degrees; and
the multilayer mirror structure is formed of a number of laminated elements, each laminated element having a first sub-unit and a second sub-unit on top of the first sub-unit, the second sub-unit having a lower index of refraction than that of the first sub-unit.

8. The grazing incidence reflector according to claim 7, wherein materials of the first sub-unit and the second sub-unit are selected from a group of Th, La, U, B, nitrides, oxides, borides, fluorides of heavy metal elements, and carbides of light elements.

9. The grazing incidence reflector according to claim 1, wherein the reflector is configured for operation at EUV wavelengths in the range 13-14 nm.

10. The grazing incidence reflector according to claim 9, wherein the first mirror layer has a thickness in the range 15-17 nm and is made of Ru, and has a reflectance greater than 40% over the first range of grazing incidence angles between greater than 0 degree and less than 25 degrees.

11. The grazing incidence reflector according to claim 10, wherein:
the second range of grazing incidence angles is greater than or equal to 25 degrees and less than or equal to 30 degrees; and
the multilayer mirror structure is formed of a number of laminated elements, each laminated element having a first sub-unit and a second sub-unit on top of the first sub-unit, the second sub-unit having a lower index of refraction than that of the first sub-unit.

12. The grazing incidence reflector according to claim 11, wherein materials of the first sub-unit and the second sub-unit are selected from a group of Mo, Si, Ru and diamond-like carbon.

13. The grazing incidence reflector according to claim 1 wherein at least one of a period and a composition of the multilayer mirror structure varies across the multilayer mirror structure so that a grazing incidence angle of maximal reflectance varies across the multilayer mirror structure.

14. A lithographic apparatus comprising a grazing incidence reflector comprising:
a first mirror layer configured to reflect at least partially EUV radiation incident on the reflector with grazing incidence angles in a first range, the first mirror layer being configured to transmit EUV radiation in a second range of incidence angles which overlaps and extends beyond the first range of incidence angles;
a multilayer mirror structure beneath the first mirror layer configured to reflect EUV radiation which is incident on the reflector with grazing incidence angles in said second range and which penetrates through the first mirror layer, and
a second mirror layer on top of the first mirror layer, the second mirror layer being configured to provide enhanced reflectance for EUV radiation with grazing incidence angles in a third range which is within the first range of angles.

15. A method for manufacturing a grazing incidence reflector configured to reflect extreme ultraviolet (EUV) radiation, the method comprising:
disposing a first mirror layer on top of a multilayer mirror structure and a surface structure on top of the multilayer mirror structure; and
disposing a second mirror layer on top of the first mirror layer; wherein the first mirror layer is configured to at least partially reflect EUV radiation incident on the reflector with grazing incidence angles in a first range, the first mirror layer being configured to transmit EUV radiation in a second range of incidence angles which overlaps and extends beyond the first range of incidence angles, and the second mirror layer being configured to provide enhanced reflectance for EUV radiation with grazing incidence angles in a third range which is within the first range of angles; and
the multilayer mirror structure is configured to reflect EUV radiation which is incident on the reflector with grazing incidence angles in said second range and which penetrates through the first mirror layer.

16. A method for manufacturing a device by a lithographic process, comprising:
illuminating a patterning device with extreme ultraviolet (EUV) radiation from an EUV source via an illumination system; and
projecting an image of the patterning device onto a substrate by projection of said EUV radiation via projection system;
wherein at least one of the illumination system or the projection system comprises a grazing incidence reflector for:
reflecting at least partially EUV radiation incident on the reflector with grazing incidence angles in a first range with a first mirror layer being configured to transmit EUV radiation in a second range of incidence angles which overlaps and extends beyond the first range of incidence angles;
providing enhanced reflectance for EUV radiation with grazing incidence angles in a third range which is within the first range of angles with a second mirror layer on top of the first mirror layer; and
reflecting EUV radiation which is incident on the reflector with grazing incidence angles in said second range and which penetrates through the first mirror layer with a multilayer mirror structure beneath the first mirror layer.

17. A method for manufacturing a grazing incidence reflector configured to reflect extreme ultraviolet (EUV) radiation, the method comprising:
disposing a first mirror layer on top of a multilayer mirror structure and a surface structure on top of the multilayer mirror structure;
wherein the first mirror layer is configured to at least partially reflect EUV radiation incident on the reflector with grazing incidence angles in a first range, the first mirror layer being configured to transmit EUV radiation in a second range of incidence angles which overlaps and extends beyond the first range of incidence angles, and the first mirror layer occupies only a portion of a surface of the multilayer mirror structure so as to provide enhanced reflectance for EUV radiation with grazing incidence angles in the second range; and the multilayer mirror structure is configured to reflect EUV radiation which is incident on the reflector with grazing incidence angles in said second range and which penetrates through the first mirror layer.

\* \* \* \* \*